United States Patent [19]
Camp, Jr. et al.

[11] 3,963,540
[45] June 15, 1976

[54] HEAT TREATMENT OF MERCURY CADMIUM TELLURIDE

[75] Inventors: Russell J. Camp, Jr., St. Louis Park; Maurice L. Hitchell, Bloomington; Joseph L. Schmit, Hopkins; Ernest L. Stelzer, Minnetonka, all of Minn.

[73] Assignee: Honeywell Inc., Minneapolis, Minn.

[22] Filed: Feb. 28, 1975

[21] Appl. No.: 554,293

[52] U.S. Cl. .................. 148/20.3; 148/1.5
[51] Int. Cl.² ............................ C22F 1/02
[58] Field of Search ............ 148/1.5, 13, 13.1, 20.3, 148/3; 75/134 H, 135, 151, 169; 252/62.3 ZT, 62.3 V, 501; 423/508

[56] References Cited
UNITED STATES PATENTS 3,622,399  11/1971  Johnson .......................... 75/135

*Primary Examiner*—R. Dean
*Attorney, Agent, or Firm*—David R. Fairbairn

[57] ABSTRACT

The stoichiometry and free-carrier concentration of mercury cadmium telluride is adjusted by a heat treatment. Mercury cadmium telluride is slowly cooled from a temperature near the solidus temperature to room temperature in the presence of constituent vapor. The mercury cadmium telluride is maintained at the lowest temperature within the capsule during cooling.

10 Claims, 4 Drawing Figures

HEAT TREATMENT OF MERCURY CADMIUM TELLURIDE

REFERENCE TO CO-PENDING APPLICATIONS

Reference should be made to a co-pending application Ser. No. 554,294 by R. J. Hager, J. L. Schmit, M. W. Scott, and E. L. Stelzer entitled "Mercury Cadmium Telluride Annealing Procedure" which is filed on even date herewith and which is assigned to the same assignee as the present application.

BACKGROUND OF THE INVENTION

The present invention is concerned with the preparation of mercury cadmium telluride. In particular, the present invention is directed to the adjustment of stoichiometry in mercury cadmium telluride. For the purposes of this specification, the common chemical equations for mercury cadmium telluride, (Hg,Cd)Te or $Hg_{1-x}Cd_xTe$, will be used.

(Hg,Cd)Te is an intrinsic photodetector material which consists of a mixture of cadmium telluride, a wide gap semiconductor ($E_g=1.6$ eV), with a mercury telluride, which is a semimetal having a "negative energy gap" of about $-0.3$ eV. The energy gap of the alloy varies linearly with $x$, the mole fraction of cadmium telluride in the alloy. By properly selecting $x$, it is possible to obtain (Hg,Cd)Te detector material having a peak response over a wide range of infrared wavelengths.

(Hg,Cd)Te is of particular importance as a detector material for the important 8 to 14 micron atmospheric transmission "window." Extrinsic photoconductor detectors, notably mercury-doped germanium, have been available with high performance in the 8 to 14 micron wavelength interval. These extrinsic photoconductors, however, require very low operating temperatures (below 30°K). (Hg,Cd)Te intrinsic photodetectors having a spectral cutoff of 14 microns, on the other hand, are capable of high performance at 77°K.

The possible application of (Hg,Cd)Te as an intrinsic photodetector material for infrared wavelengths was first suggested by W. G. Lawson et al, J. Phys. Chem. Solids, 9, 325 (1959). Since that time extensive investigation of (Hg,Cd)Te detectors have been achieved for wavelengths from about 1 to 30 microns.

Despite the potential advantages of (Hg,Cd)Te as an infrared detector material, (Hg,Cd)Te photodetectors have only recently found wide use in infrared detector systems. The main drawback of (Hg,Cd)Te has been the difficulty in preparing high quality, uniform material in a consistent manner. The preparation of (Hg,Cd)Te crystals having n-type conductivity, which is the desired conductivity type for photoconductive detectors, has been found to be particularly difficult.

Several properties of the Hg-Cd-Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Conventional crystal growth methods, which involve slow cooling along the length of an ingot, produce an extremely inhomogenous body of (Hg,Cd)Te. Second, the high vapor pressure of Hg over the melt makes it difficult to maintain melt stoichiometry. Third, the segregation of excess Te can give rise to pronounced constitutional supercooling.

The crystal preparation technique which has been most successful in producing high quality (Hg,Cd)Te is the technique described by P. W. Kruse et al in U.S. Pat. No. 3,723,190. This technique involves the bulk growth of homogenous (Hg,Cd)Te alloy crystals by a three part method. First, a liquid solution of the desired alloy composition is quenched to form a solid body of (Hg,Cd)Te. Second, the body is annealed at a temperature near but below the solidus temperature to remove dendrites. Third, the (Hg,Cd)Te is annealed at low temperature in the presence of excess Hg to adjust stoichiometry. This final low temperature anneal takes about 10 to 30 days.

SUMMARY OF THE INVENTION

The method of the present invention allows mercury cadmium telluride to be converted from p-type to n-type material in less time than is possible with prior art techniques. In the method of the present invention, mercury cadmium telluride is cooled from a temperature near the solidus temperature in the presence of the constituent vapors as primarily supplied by a source other than the sample. The mercury cadmium telluride is maintained at the lowest temperature within the container during the cooling step.

A BRIEF DESCRIPTION OF THE DRAWINGS

DETAILED DESCRIPTION OF THE PREFERRED EMBODIMENTS

The present invention is a heat treatment for mercury cadmium telluride which allows the adjustment of conductivity type and free-carrier concentration by control of stoichiometry. These adjustments have two objectives. First, the desired mercury cadmium telluride should be n-type conductivity with a low freecarrier concentration. This material is highly advantageous for photodetector applications. Second, the acceptor concentration should be as low as possible while still meeting the first objective.

The free-carrier concentration of mercury cadmium telluride can be described in terms of the number of donors caused by foreign atoms or impurities, $N_{Di}$; the number of donors caused by stoichiometric defects, $N_{Ds}$; the number of acceptors caused by foreign atoms, $N_{Ai}$; and the number of acceptors caused by stoichiometric defects, $N_{As}$. The free-carrier concentration may be described as $$n_o = (N_{Di} + N_{Ds}) - (N_{Ai} + N_{As}) + p_o$$

The present invention may be used to control conductivity type and free-carrier concentration of mercury cadmium telluride materials in which native acceptors, $N_{As}$, and foreign donors, $N_{Di}$, are dominant. In these materials, the free-carrier concentration is approximately $N_{Di} - N_{As}$.

In the present invention, mercury cadmium telluride is cooled in a closed environment in the presence of constituent vapor from a temperature near the solidus temperature. The mercury cadmium telluride is maintained in the coolest portion of the container. This method takes much less time than the prior art method by adjusting stoichiometry and free-carrier concentration in mercury cadmium telluride.

Figure 1A:
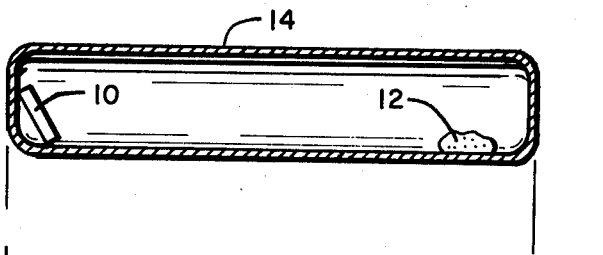
FIGS. 1a and 1b show a capsule and temperature profile, respectively, used in one embodiment of the present invention.

FIG. 1 shows one embodiment of the present invention. A mercury cadmium telluride body 10 and excess constitutents 12 are heated in a closed capsule or container 14. Mercury cadmium telluride body 10 may be a thin slice, as shown in FIG. 1a, or an entire ingot.

Figure 1B:
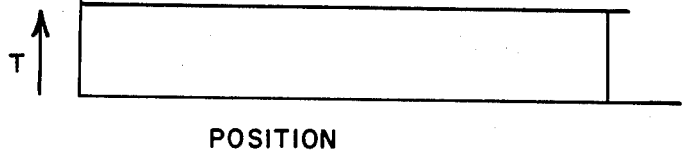

FIG. 1b shows the temperature profile within capsule 14 as a function of position. As shown in FIG. 1b, there is no position within capsule 14 which is any cooler than the position at which mercury cadmium telluride body 10 is located. This temperature profile is maintained while mercury cadmium telluride body 10, capsule 14, and the vapor from excess constituents 12 is cooled from a temperature near but below the solidus temperature to a temperature substantially below the solidus temperature (usually 250°C).

Figure 2A:
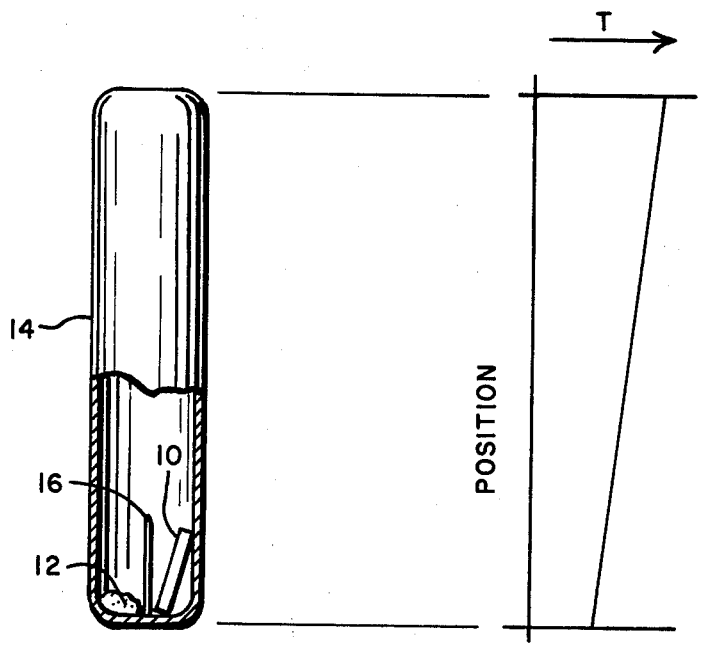
FIGS. 2a and 2b show a capsule and temperature profile, respectively, used in another embodiment of the present invention.
Figure 2B:
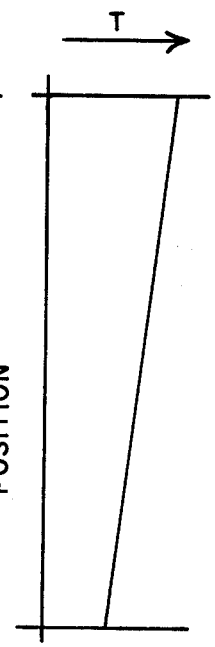

FIGS. 2a and 2b illustrate another embodiment of the present invention, in which capsule 14 is placed in a vertical rather than a horizontal position. In this case, separator 16 may be provided to keep mercury cadmium telluride body 10 and the excess constituents 12 separated. FIG. 2b shows a temperature profile as a function of position. As shown in FIG. 2b, mercury cadmium telluride body 10 is again maintained in the coolest portion of capsule 14. The opposite end of capsule 14 is at a slightly higher temperature. This temperature profile is then maintained as the capsule 14 constituent vapor and body 10 are cooled from near the solidus temperature to room temperature.

The following examples further demonstrate the present invention.

EXAMPLE 1

A mercury cadmium telluride ingot was grown containing n-type material. The growth procedure included the method of the present invention.

A capsule was loaded with 106.8086 grams mercury, 13.7635 grams cadmium, and 52.2180 grams tellurium. This corresponded to a nominal composition of $x=0.19$ with excess mercury of 2.1200 grams.

The loaded capsule was heated to a temperature of 820°C and was rocked for approximately 20 hours to assure thorough mixing of the materials. The capsule was then rapidly coold from 820°C (which is above the liquidus temperature) to about 650°C (which is below the solidus temperature) to solidify the mercury cadmium telluride The capsule was then heated to 670°C and maintained at that temperature for about 6 days. This 6 day anneal at near but below the solidus temperature was to remove dendrites formed in the mercury cadmium telluride crystal by the rapid solidification.

After the 6 day high temperature anneal, the capsule was slowly cooled at a rate of about 12°C per hour to room temperature. The temperature profile of the capsule during cool-down was such that the mercury cadmium telluride crystal was located in the coolest portion of the capsule.

The excess mercury which had been loaded in the crystal provided a mercury vapor pressure during the cool-down process. The mercury vapor pressure was necessary to reduce native acceptor concentration in the mercury cadmium telluride ingot.

A 10 mm section, approximately 140 mm from the tip of the ingot was tested and found to exhibit n-type conductivity. A 1 mm thick plank was fabricated into a Hall effect sample in order to measure conductivity type and free-carrier concentration. The Hall effect data identified the plank positively as uncompensated n-type conductivity with approximately $6.75 \times 10^{15}$ carriers $cm^{-3}$.

EXAMPLE 2

A second bulk crystal was grown by essentially the same procedure described in Example 1. The slow cool-down process to adjust stoichiometry and free-carrier concentration was again used.

The second bulk grown ingot, however, did not exhibit n-type conductivity. Subsequent tests have indicated that this second bulk grown crystal contained more impurity acceptors than impurity donors. It is believed that this crystal was not converted to n-type conductivity by the slow cool-down process because the process reduces only native acceptor concentration.

EXAMPLE 3

A 10 mm section of an as-grown p-type crystal having $x=0.380$ and weighing 6.1 grams was annealed in a sealed 16 $cm^3$ quartz capsule containing 0.0645 grams mercury $cm^{-3}$ and 0.245 grams of mercury cadmium telluride chips. The capsule was heated to 600°C and maintained at that temperature for about 2 hours. The capsule was then cooled at a rate of 25°C per hour while maintaining both the mercury cadmium telluride slice and the excess constituents at the lowest temperature within the capsule.

The mercury cadmium telluride converted to n-type to a depth of approximately 1 mm. A 1 mm thick slice from one end of the 10 mm section thermoprobed n-type and was then processed into a 0.37 mm thick Hall sample. The Hall effect measurements indicated that the 0.37 mm slice was n-type with $n_0=3.8 \times 10^{15}$ $cm^{-3}$.

Six samples from the same p-type crystal had previously been converted to n-type using 59 to 83 day anneals at between 257°C and 301°C. These six samples had $n_0$ values ranging from 3.7 to $4.8 \times 10^{15}$ $cm^{-3}$. This demonstrated that the one day slow cool from near the solidus temperature can be as effective as a two to three month anneal at approximately 300°C.

EXAMPLE 4

Another 10 mm long section from the same crystal used in Example 3 was heat treated using the present invention. The 10 mm section and an 11 mm section from a second p-type crystal were loaded into a 4.26 $cm^3$ volume quartz capsule. The two mercury cadmium telluride sections had a total weight of 15.6 grams. 0.061 grams of mercury cadmium telluride chips and 0.0645 grams of mercury $cm^{-3}$ were also added to the capsule.

The capsule was heated to 600°C in 5.5 hours and held at 600°C for 41 hours. The capsule was then cooled at a rate of 10°C per hour while maintaining the mercury cadmium telluride sections in the coolest portion of the capsule.

A 0.965 mm thick Hall sample was fabricated from one face of the 10 mm thick section. The Hall measurements indicated that the sample was n-type conductivity having $n=4.8 \times 10^{15}$ $cm^{-3}$. This value of $n_0$ is within the range of 3.7 to $4.8 \times 10^{15}$ $cm^{-3}$ established by the 59 to 83 day anneals. However, the 11 mm thick section converted to n-type to a depth of only 0.07 mm.

EXAMPLE 5

Three p-type one millimeter thick slices of mercury cadmium telluride were loaded into a 4 cm$^3$ volume quartz capsule with 0.26 grams of excess mercury and 0.061 grams mercury cadmium telluride powder. The capsule was heated to 655°C and maintained at that temperature for about 6 days. The capsule was then cooled at a rate of about 10°C per hour while maintaining the mercury cadmium telluride slice in the coolest portion of the capsule. All three mercury cadmium telluride slices were converted entirely to n-type conductivity. It appears, therefore, that the time period at which the capsule is maintained at the higher temperature before the cool-down is commenced has some effect on the extent of the conversion from p-type to n-type.

Conclusion

From Examples 1 through 5, several conclusions can be drawn.

First, the present invention may be incorporated as part of a bulk growth process, as illustrated by Example 1.

Second, the present invention may also be used to adjust the stoichiometry and free-carrier concentration of mercury cadmium telluride slices.

Third, the present invention reduces native acceptor concentration but not impurity acceptor concentration. The present invention, therefore, may not convert certain p-type mercury cadmium telluride to n-type conductivity if the impurity acceptor concentration is too high. This is also true of the prior art methods.

Fourth, the extent of conversion from p-type to n-type conductivity appears to be affected by the length of time at which the capsule is maintained at the high temperature immediately prior to cool-down. It is believed that longer periods at the high temperature prior to cool-down allows donor type defects to equilibrate. The preferred embodiments of the present invention, therefore, maintain the capsule at the higher temperature for a period greater than two hours in order to allow the defects to equilibrate.

Fifth, either excess mercury vapor alone or mercury, cadmium, and tellurium vapors combined have been used in the present invention. The previously mentioned co-pending patent application Ser. No. 554,294 by R. J. Hager et al describes the advantages of using both mercury and cadmium vapor when adjusting stoichiometry of mercury cadmium telluride.

Sixth, the Examples demonstrate that the slow cool-down process of the present invention can be as effective as the prior art methods. The present invention, however, requires far less time (a few days) than the prior art methods.

The present invention has been described with reference to a series of preferred embodiments. Workers skilled in the art, however, will recognize that modifications can be made without departing from the spirit and scope of the present invention. In particular, applications exist which require low carrier concentration p-type material; the present invention can be used to adjust carrier concentrations of either electrical type.

The embodiments of the invention in which an exclusive property or right is claimed are defined as follows:

1. A method of adjusting the stoichiometry of mercury cadmium telluride, the method comprising:

heating a body of mercury cadmium telluride and a quantity of excess constituent in a closed environment to a temperature near the solidus temperature of the body to provide a constituent vapor pressure within the closed environment; and cooling the closed environment while maintaining a temperature profile within the closed environment to prevent any portion within the closed environment from being cooler than the body.

2. The method of claim 1 wherein the excess constituent is selected from the group consisting of mercury, cadmium, tellurium, and mixtures thereof.

3. The method of claim 1 wherein cooling is at a rate of less than about 25°C per hour.

4. The method of claim 1 and further comprising maintaining the closed environment at a temperature near the solidus temperature for a time period sufficient to equilibrate defects prior to cooling.

5. A method of adjusting the stoichiometry and free-carrier concentration of a body of mercury cadmium telluride, the method comprising cooling a body of mercury cadmium telluride in a closed container in the presence of constituent vapor from a source other than the body from a temperature near the solidus temperature to a temperature substantially below the solidus temperature while maintaining the mercury cadmium telluride body at the lowest temperature within the closed container.

6. The method of claim 5 wherein the constituent vapor includes mercury vapor.

7. The method of claim 6 wherein the constituent vapor pressure further includes cadmium vapor.

8. The method of claim 5 wherein the cooling is at a rate of less than about 25°C per hour.

9. The method of claim 5 and further comprising maintaining the body in the closed container at temperature near the solidus temperature for a period of greater than 2 hours prior to cooling.

10. The method of claim 5 wherein the entire closed container has essentially the same temperature during cooling.

* * * * *